United States Patent [19]

Pan

[11] Patent Number: 5,760,435
[45] Date of Patent: Jun. 2, 1998

[54] USE OF SPACERS AS FLOATING GATES IN EEPROM WITH DOUBLED STORAGE EFFICIENCY

[75] Inventor: Yang Pan, Singapore, Singapore

[73] Assignee: Chartered Semiconductor Manufacturing, Ltd., Singapore, Singapore

[21] Appl. No.: 635,993

[22] Filed: Apr. 22, 1996

[51] Int. Cl.[6] ................................................. H01L 29/72
[52] U.S. Cl. ..................... 257/314; 257/315; 257/316; 257/321; 257/403; 438/157; 438/176; 438/267; 438/522; 438/694
[58] Field of Search ............................... 257/316, 321, 257/314, 315, 403; 438/157, 176, 267, 522, 694

[56] References Cited

U.S. PATENT DOCUMENTS

| | | | |
|---|---|---|---|
| 5,021,999 | 6/1991 | Kohda et al. | 257/316 |
| 5,168,465 | 12/1992 | Harari | 257/320 |
| 5,267,194 | 11/1993 | Jang | 365/185 |
| 5,414,286 | 5/1995 | Yamauchi | 257/315 |
| 5,414,287 | 5/1995 | Hong | 257/316 |
| 5,614,747 | 3/1997 | Ahn et al. | 257/319 |

OTHER PUBLICATIONS

S. Wolf, "Silicon Processing In The VLSI–vol. 2", Lattice Press, Sunset Beach, CA, pp. 632–634.

*Primary Examiner*—Eward Wojciechowicz
*Attorney, Agent, or Firm*—George O. Saile; Stephen B. Ackerman

[57] ABSTRACT

A method of forming a high density cell in electrically erasable and programmable read only memory (EEPROM) is disclosed. The doubling efficiency is achieved through providing two floating gates in a single cell, unlike what is found in prior art. While the polysilicon control gate is formed by conventional means, the floating gates are formed through a novel method of forming additional polysilicon spacers which are then coupled with lightly doped drain (LDD) regions to function as floating gates. Furthermore, the cell is turned on and off through the modulation of the LDD resistance and not through charge saturation methods of prior art. Finally, it is shown that through the use of two floating gates, rather than one, two bits of information can be stored in one cell with the concomitant advantage of doubled efficiency.

31 Claims, 4 Drawing Sheets

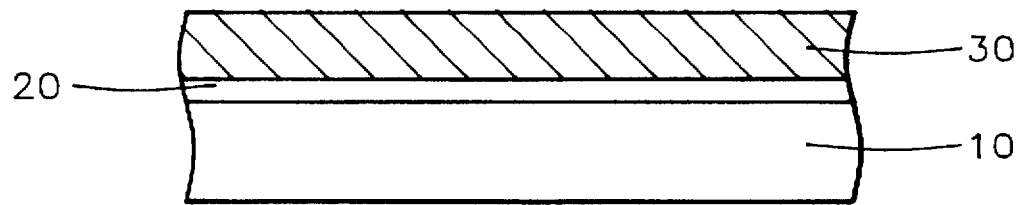
FIG. 1 - Prior Art
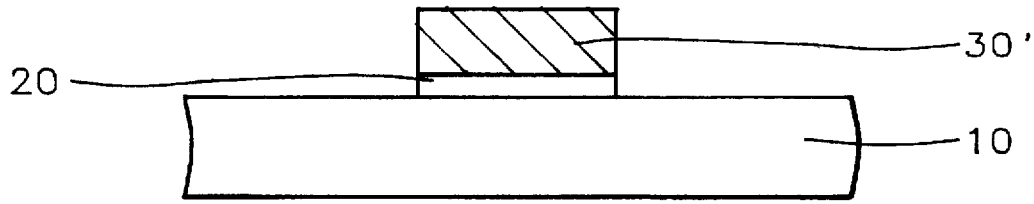
FIG. 2
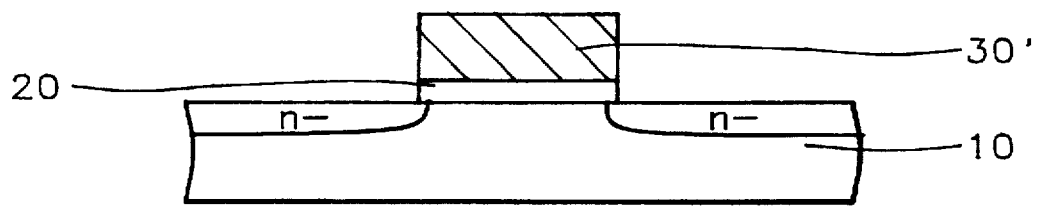
FIG. 3

USE OF SPACERS AS FLOATING GATES IN EEPROM WITH DOUBLED STORAGE EFFICIENCY

BACKGROUND OF THE INVENTION

(1.) Field of the Invention

The invention relates generally to semiconductor memories and more particularly, to a method for doubling the efficiency of memory cells by using spacers as floating gates.

(2.) Description of the Related Art

Semiconductor memories store information in digital computers. The information resides in memory cells and special devices are used to store and retrieve information from the cells. In general, a memory device consists of an array of MOSFET (Metal Oxide Semiconductor Field Effect Transistor) cells arranged in columns and rows where selected MOSFETs are rendered conductive, or non-conductive, depending on the type of transistor. The ability to set the conductive state of each cell provides a means for storing binary information.

The most flexible digital memories are those that allow for the storage (of writing) as well as data retrieval (or reading). Memories in which both of these functions can be rapidly and easily performed, and whose cells can be accessed in a random order are referred to as random-access-memories or RAMs. In semiconductor RAMs, information is stored on each cell either through the charging of a capacitor or the setting of the state of a bistable flipflop circuit. With either method, the information on the cell is destroyed if the power is interrupted. Such memories are referred to as volatile memories.

It is often desirable to use memories that will retain information even when the power is temporarily interrupted or no longer applied. As is well known, such nonvolatile memories are provided by read-only memories (ROMs) in which only the read operation can be performed rapidly. The different types of ROMs are characterized by the manner in which data is entered into them. Thus, the first type of nonvolatile memories consists of those ROMs in which data is entered during manufacturing, and cannot subsequently be altered by the user. These devices are known simply as ROMs. The next category consists of memories whose data can be entered by the user only once, and are known as programmable ROMs, or PROM. In the remaining ROM types, data can be erased as well as entered. In one class of erasable ROMs, the cells must be exposed to a strong ultraviolet light in order for stored data to be erased. These ROMs are called erasable-programmable ROMs, or EPROMS. In other words, EPROM devices differ from ROMs in their ability to be programmed and erased by a user, albeit with an external circuit, after the manufacturing process is complete. In the final type, data can be erased as well as entered into the device electrically within the circuit; these are referred to as EEPROMs. We note for completeness that the time needed to enter data into both EPROMs and EEPROMs is much longer than the time required for the write operation in a RAM. To emphasize this point, entering data or "writing" into a ROM is referred to as programming the ROM, and, thus, none of the state of the art read-only-memories, ROMs, can be classified as fully functional random-access-memory, RAM.

The unit cell of an EEPROM memory device is usually comprised of a silicon substrate provided with a source and a drain, and two polysilicon gates; that is, a MOS transistor having a channel defined by the source and drain regions, a floating gate to which there is no direct electrical connection and a control gate with a direct electrical connection. The floating gate is separated from the substrate by an insulating layer of for example, silicon oxide. The control gate is generally positioned over the floating gate with a layer of insulating material separating the two gates. To program a transistor, charge is transferred from the substrate through the insulator and is stored on the floating gate of the transistor. The amount of charge is set to one of two levels to indicate whether the cell has been programmed "on" of "off". "Reading" of the cell's state is accomplished by applying appropriate voltages to the cell source and drain, and to the control gate, and then sensing the amount of charge on the floating gate. To erase the contents of a cell, the programming process is reversed, namely, charges are removed from the floating gate by transferring them back to the substrate through the insulator. A fairly recent technology is "flash" memories in which the entire array of memory cells, or a significant subset thereof, is erased simultaneously. Flash EEPROMs combine the advantages of UV-erasable EPROMS and floating-gate EEPROMs. They offer high density, small cell size, the well-known hot-electron writability of EPROMs, together with the easy erasability, on-board reprogrammability, and electron-tunneling erasure feature of EEPROMs (See S. Wolf, "Silicon Processing for the VLSI Era," vol. 2 , Lattice Press, Sunset Beach, Calif., 1990, pp. 632–634.)

Programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of critical importance in the tunneling region is the quality and the thinness of the tunneling oxide separating the floating gate from the substrate. Usually a thickness of between about 80 to 120 Angstroms is required to facilitate Fowler-Nordheim tunneling. The quality is hard to achieve because of defects in manufacturing. With defects, high voltages cause charge to pass through defective oxide, thereby causing the loss of valuable data. Solutions have been proposed in prior art to alleviate some of these problems.

U.S. Pat. No. 5,267,194 advances a method of forming an EEPROM cell which includes a control gate with a reentrant profile, and a floating gate adjacent to and conforming to the reentrant profile in the control gate. In other words, the floating gate in said patent is placed next to an insulator side-wall laterally adjacent to the reentrant control gate, rather than vertically below a non-reentrant control gate surrounded by an insulator, as is done conventionally. With this rendition of the structure of the cell, it is claimed that the efficiency of the electron channeling, or the Fowler-Nordheim tunneling is improved both during the programming as well as the erasing of the cell. It is stated, moreover, that programming and erasing is achieved with higher speed and lower power. In U.S. Pat. No. 5,414,286 another cell structure is proposed still utilizing a floating gate on a sidewall, but with the control gate covering the floating gate continuously from one side to the top of the floating gate, with an intervening insulator therebetween. With a proper arrangement of these cells of this particular structure, leakage current is prevented from flowing in an unselected cell which is in the same word line as the selected cell and which is in the over-erase state. In another approach described in U.S. Pat. No. 5,414,287, a vertical structure is proposed where the lateral area of the cell is reduced in order to increase the density of the semiconductor chip. This is accomplished by forming a vertical "silicon island" from a p-well region formed over a silicon substrate. The inner parts of the sidewalls of the island are utilized as the channel region of the device, and the floating gate as well as the control gate are formed over the outside of the sidewalls with an insulating layer therebetween.

It will be known to those in the art that the cell structures described above all store one bit of information at a time. Moreover, the floating gate is, in some way or another, either covered by or overlapped by the control gate. Finally, the cells are turned "on" and "off" based on the conventional change in the resistance of the channel as a function of the charge on the floating gate. As a result, some of the problems presented by the prior art include the relatively large areas that must be used to build the cell structures, the "over-erase" conditions encountered where positive charge is left over on the floating gate after an erase, and the difficulty of building and processing cell structures that are mostly vertical. Most importantly, the structures so described do not lend themselves to increasing the storage efficiency of the EEPROM devices.

SUMMARY OF THE INVENTION

It is therefore an object of this invention to provide a method of forming a high density memory cell with one control gate and two floating gates of doubled storage efficiency for use in electrically erasable programmable read-only memory (EEPROM) or flash-memory.

It is a further object of this invention to provide a high density memory cell with one control gate and two floating gates, for an electrically erasable programmable read-only memory (EEPROM) or flash-memory, using an easily manufactured side-by-side poly structure.

It is still another object of the invention to provide a method for switching memory cells through the modulation of LDD resistance and thereby alleviating the "over-erasing" problem encountered in EEPROMs.

These objects are achieved by a cell structure having two floating gates, one on each side of a rectangularly shaped control gate formed over a silicon substrate. A dielectric layer therebetween insulates the gates which are formed from polysilicon (PolySi) or silicon-nitride (SiN). The said dielectric between the gates is a layer of $SiO_2$ film or ONO film consisting of SiO2, SiN, and $SiO_2$ deposited in this order. The control gate in between the floating gates is separated from the silicon substrate below by gate oxide, while the floating gates reside on thin tunnel oxide layers formed over lightly doped drain (LDD) regions in the substrate. In this structure, the drain is formed by two implants. One of these is self-aligned to the control gate electrode, and the other is self-aligned to the floating gate electrodes that are formed as two sidewall spacers.

These objects are further achieved by a method of manufacturing in which polysilicon or silicon-nitride is deposited over a substrate provided with a layer of oxide. A layer of polysilicon is next deposited over the oxide and then the gate structure is patterned using a resist mask as practiced in prior art. Following the exposure and development of the resist, the polysilicon film is etched to form the control gate over the gate oxide. Using the polysilicon gate and the gate oxide as an implant mask, the first and lighter of the two ion implantations is performed to form one of the lightly doped regions of the LDD structure. Layers of SiO2, SiN, and $SiO_2$, that is, a layer of ONO is formed over the gate structure and then etched back to form spacers on the sidewalls of the gate. A blanket layer of thin tunnel oxide is then grown over the substrate. Another thick layer of PolySi or SiN is deposited and etched back to form wide PolySi or SiN spacers adjacent to the relatively narrower ONO spacers. Using the side-by-side PolySi structures as an implant mask, the second of the two ion implantations is performed to complete the LDD structure.

The totality of these objects is accomplished by providing doubled bit storage in two side-wall floating gates and the switching of the cells "on" and "off" through the modulation of the LDD resistance in contrast with the charge saturation methods of the prior art.

BRIEF DESCRIPTION OF THE DRAWINGS

FIG. 1 shows a portion of a semiconductor substrate covered with a layer of thermal oxide which in turn is covered by a layer of polysilicon in accordance with prior art methods.

FIG. 2 is a cross-section of a substrate showing polysilicon gate and gate oxide patterned over the substrate in accordance with the present invention.

FIG. 3 is a cross-section of a substrate showing regions that have been implanted with a first ion-implant in accordance with this invention.

DESCRIPTION OF THE PREFERRED EMBODIMENTS

Figure 4:
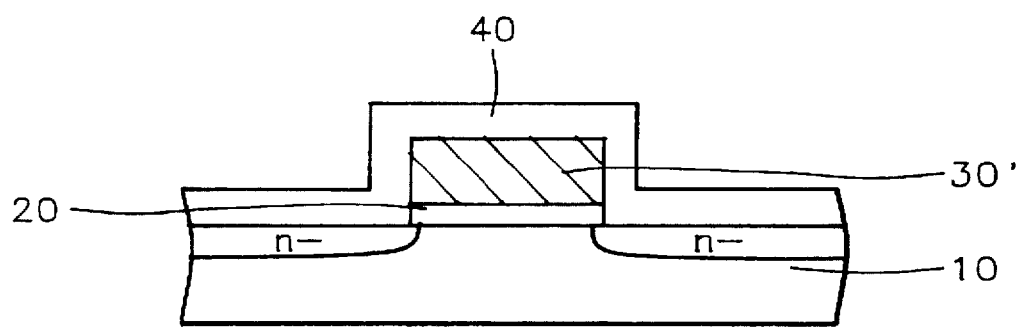
FIG. 4 is a cross-section of a substrate with a layer of $SiO_2/SiN/SiO_2$ (ONO) deposited over the gate in accordance with this invention.
Figure 5:
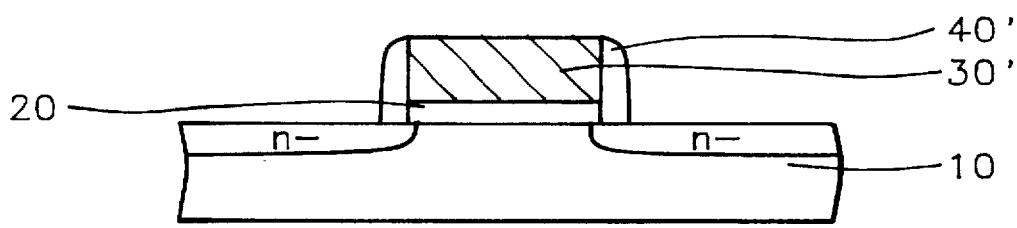
FIG. 5 is a cross-section of a substrate showing the forming of ONO spacers of this invention.

Referring now to the drawings, more particularly to FIGS. 2 through 9, there is illustrated a method and resulting structure of the novel process for producing a memory cell with doubled storage efficiency for a flash memory or EEPROM. The process begins in FIG. 1 with a substrate (10), preferably silicon, on which are formed a silicon oxide

(20) and a polysilicon (30) layer using prior art methods. In one embodiment of the present invention, the silicon oxide layer (20) is thermally grown to a thickness of between about 100–400 Angstroms (Å) and the polysilicon layer (30) is deposited to a thickness of between about 2,000 to 4,000 Å. The structure as shown in FIG. 1 is then doped with phosphorous at an energy of between about 60 to 70 KEV and a total dosage of between about $1\times10^{15}$ to $1.5\times10^{16}$ atoms/cm$^2$ to form a conductive layer of polycrystalline silicon which will subsequently be used to form a plurality of conductive control gates on the EEPROM.

Figure 9:
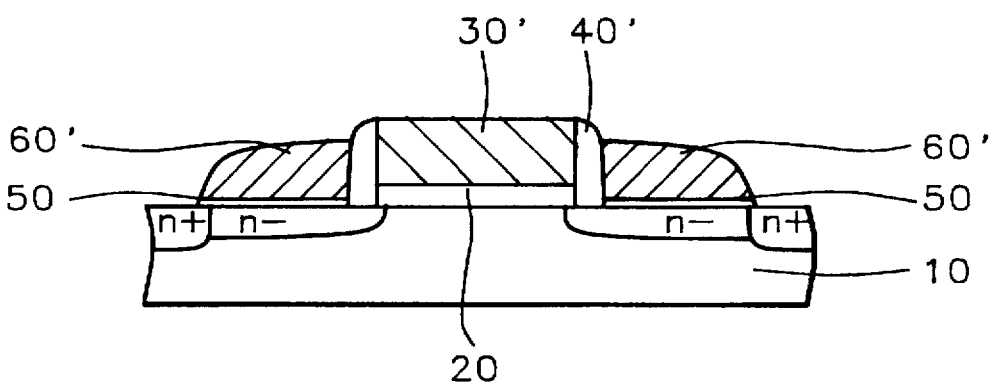
FIG. 9 is a cross-section of a substrate showing also the region of the second ion implantation in the LDD structure of this invention with one control gate and two floating-gates.

Using conventional processes, a photoresist (not shown) is formed on the structure of FIG. 1 and an opening is formed in the photoresist. Then, the polysilicon layer (30) is anisotropically etched to form the polysilicon control gate (30') as shown in FIG. 1. Referring more particularly to FIG. 2, the process continues with the ion implantation—using the polysilicon gate and gate oxide as an implant mask—of the regions (n$^-$) of lightly doped drains (LDD) to be completed at a later step as shown in FIG. 9. This first implantation is of a light concentration in between about $1\times10^{13}$ to $1\times10^{14}$ atoms/cm$^2$ of phosphorus at an energy of between about 20 to 100 KEV.

Figure 6:
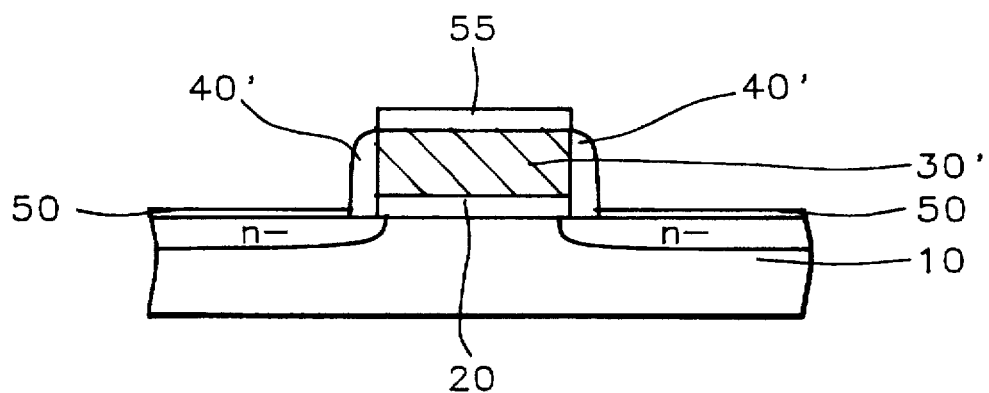
FIG. 6 is a cross-section of a substrate showing the growth of tunnel oxide in accordance with this invention.

Referring now to FIG. 4, layers of silicon oxide SiO$_2$, silicon-nitride SiN, and SiO$_2$ are formed, in the order given, to form a composite ONO film (40). These insulating films can be formed by conventional methods such as chemical vapor deposition, CVD. The preferred thickness of each insulating layer is between about 100 to 150 Angstroms (Å), with a total ONO thickness of between about 300 to 500 (Å). The ONO film is then anisotropically etched back to form oxide spacers (40') shown in FIG. 5. A blanket layer of thin tunnel oxide is next grown over the substrate. The thickness of the tunnel oxide (50) in this embodiment of the present invention is between about 80 to 120 Angstroms (Å), where the thicker top oxide layer (55) usually grows on the PolySi than on the silicon (Si) as depicted in FIG. 6.

Figure 7:
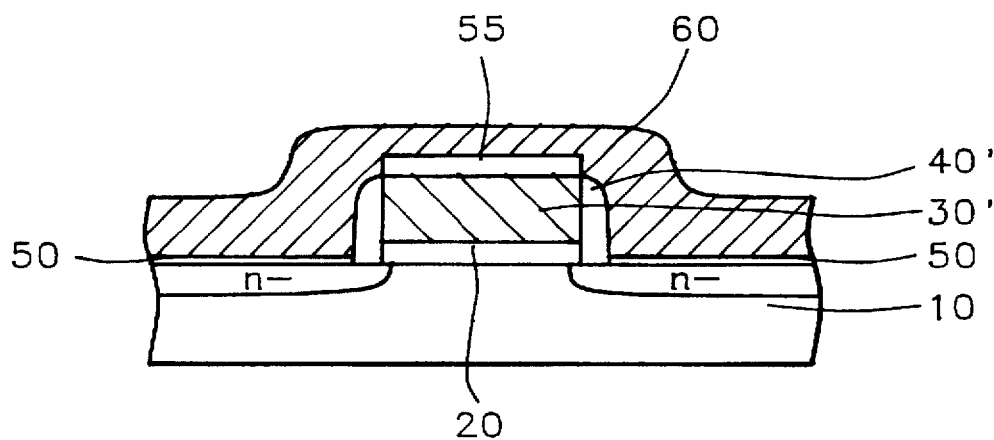
FIG. 7 is a cross-section of a substrate covered with polysilicon in accordance with this invention.
Figure 8:
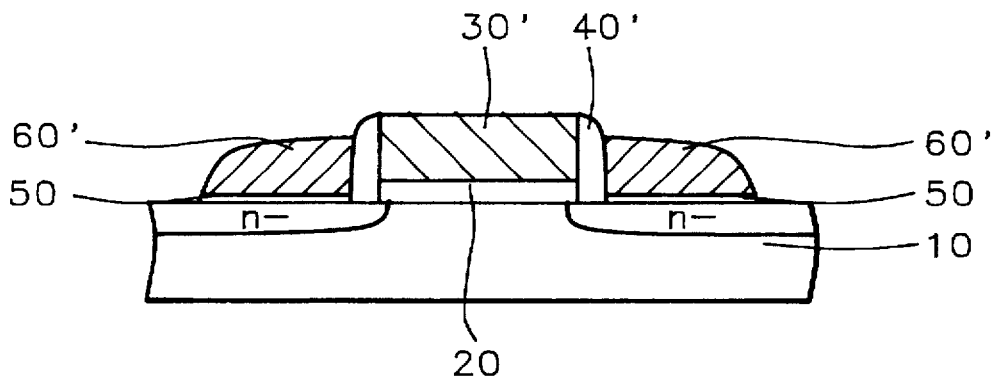
FIG. 8 is a cross-section of a substrate showing the formed side-by-side polysilicon gates of this invention and separated by ONO spacers.

The second layer of polysilicon (60) of FIG. 7 is deposited to a thickness of between about 2,000 to 4,000 Å over the substrate shown in FIG. 7 and then etched back to form the wide spacers 60' shown in FIG. 8. It is preferred that this layer of polysilicon be doped to a level in between about $1\times10^{15}$ to $1\times10^{16}$ atoms/cm$^2$ of phosphorus at energy between about 20 to 50 KEV, to reduce the polyresistance, thereby allowing the electrons to move freely in the PolySi spacers 60' which are now the floating gates. It will be noted in FIG. 8 that the PolySi (60) of FIG. 7 has been over-etched to remove the top oxide layer (55) of the latter Fig.. Although this is the preferred mode, it is not necessary. In still another embodiment, thick silicon-nitride (SiN) of between about 2,000 to 4,000 Å can be deposited in place of the PolySi. Using now the side-by-side Polysi structure as an implant mask, the heavier second ion implantation of dosage of between about $1\times10^{15}$ to $1\times10^{16}$ atoms/cm$^2$ of arsenic is performed in the (n$^+$) regions shown in FIG. 9.

Figure 10:
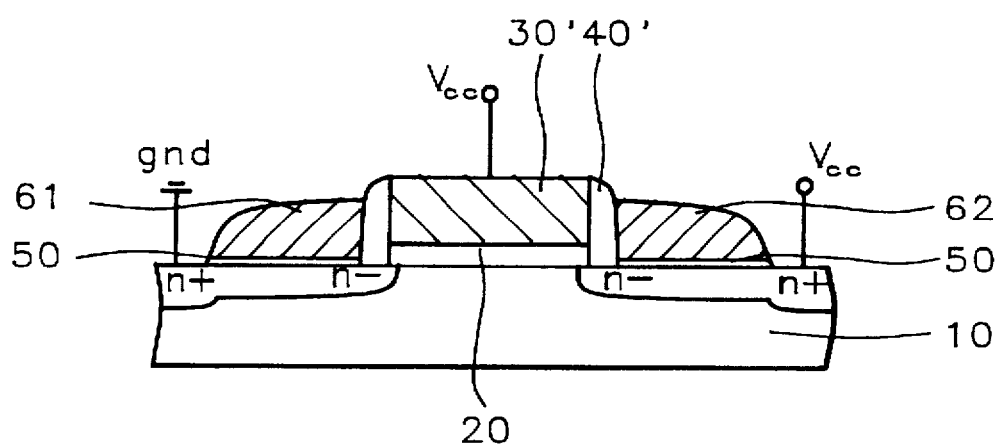
FIG. 10 shows the biasing of the side-by-side gates of this invention.

The programming of this double storage cell using the modulation of the LDD resistance is accomplished by the Fowler-Nordheim tunneling as shown in FIG. 10 where bias is applied to control gate 30' and to each of the n$^+$ regions. The principle of operation can be illustrated by considering the "read" operation of each floating gate. The presence of two independent storage cells is evidenced by the noninterference of one by the other during any of the read, write or erase operations. Thus, supposing that the left gate or cell (61) is to be read, and using the convention that a "0" means no charge is stored and "1" means charge is stored, then, Case I: when left cell (61) is "0", right cell (62) is "0", no charges are stored in the sidewall gates and, therefore, the transistor operates as a normal transistor in this mode.

Case II: when left cell (61) is "1", right cell (62) is "0", electron charge is stored in the left floating sidewall gate (61). In this mode, the trapped electrons in the sidewall will deplete the $n^-$ region and there will be no current flow from the right to the left.

Case III: when left cell (61) is "0", right cell (62) is "1", the left cell is in normal transistor source mode and the right cell is stored with charged electrons. In this mode, therefore, there is a current flow from right to left.

Case IV: when left cell (61) is "1" and right cell (62) is "1", both left and right n– regions are depleted, and therefore, there is no current flow.

Summarizing the four cases,

| CASE | Left Cell | Right Cell | Current Flow |
| --- | --- | --- | --- |
| I | 0 | 0 | Yes |
| II | 1 | 0 | No |
| III | 0 | 1 | Yes |
| IV | 1 | 1 | No | it is evident that whenever the left cell (61) in FIG. 10 is in state "0", there is a current flow irrespective of the status of the right cell (62). On the other hand, whenever the left cell is in state "138 , there is no current flow.

While the invention has been particularly shown and described with reference to the preferred embodiments thereof, it will be understood by those skilled in the art that various changes in form and details may be made without departing from the spirit and scope of the invention.

What is claimed is:

1. A method of forming side-by-side, double floating gates in an electrically erasable programmable read only memory (EEPROM) with doubled storage efficiency comprising the steps of:

providing a semiconductor substrate having a layer of silicon oxide;

providing a layer of polycrystalline silicon deposited over said silicon oxide;

patterning said polycrystalline silicon and silicon oxide layers to form a control gate;

doping said control gate ion-implanting said substrate using said control gate; as a mask;

depositing three layers of dielectric over said substrate;

etching said dielectric layers;

growing a tunnel oxide over said dielectric layers; depositing a second layer of polycrystalline silicon over said substrate;

etching back said polycrystalline silicon layer to form side-by-side double floating gates adjacent to said control gate;

ion-implanting said floating gates; and ion-implanting said substrate to complete a lightly doped drain (LDD) structure.

2. The method of claim 1, wherein the thickness of the silicon oxide layer is in between about 100 to 400 Angstroms (Å).

3. The method of claim 1, wherein the thickness of the polycrystalline silicon layer is in between about 2,000 to 4,000 Å.

4. The method of claim 1, wherein said control gate is doped with phosphorous.

5. The method of claim 4, wherein said doping dosage is in between about $1\times10^{15}$ to $1\times10^{16}$ atoms/cm$^2$.

6. The method of claim 4, wherein the energy level of said doping is in between about 60 to 70 KEV.

7. The method of claim 1, wherein said ion-implant of the substrate is phosphorus.

8. The method of claim 7, wherein the concentration of said ion-implant is in between about $1\times10^{13}$ to $1\times10^{13}$ atoms/cm$^2$.

9. The method of claim 7, wherein the energy of said ion-implant is in between about 20 to 100 KEV.

10. The method of claim 1, wherein the first layer of said dielectrics is silicon oxide.

11. The method of claim 10, wherein the thickness of said first layer of silicon oxide is between about 100 to 150 Å.

12. The method of claim 1, wherein the second layer of said dielectrics is silicon nitride (SiN).

13. The method of claim 12, wherein the thickness of said second layer of SiN is between about 100 to 150 Å.

14. The method of claim 1, wherein the third layer of said dielectrics is silicon oxide.

15. The method of claim 14, wherein the thickness of said third layer of dielectric is between about 100 to 150 Å.

16. The method of claim 1, wherein the said dielectric layers are anisotropically etched to form ONO spacers.

17. The method of claim 1, wherein the thickness of said tunnel oxide is between about 80 to 120 Å.

18. The method of claim 1, wherein the thickness of said second layer of polycrystalline silicon is between about 2,000 to 4,000 Å.

19. The method of claim 18, wherein said second polycrystalline silicon is etched back to form floating gate spacers.

20. The method of claim 1, wherein said floating gates are ion-implanted with phosphorus.

21. The method of claim 20, wherein the concentration of said ion-implant is between about $1\times10^{15}$ to $1\times10^{16}$ atoms/cm$^2$.

22. The method of claim 20, wherein the energy of said ion-implant is between about 20 to 50 KEV.

23. The method of claim 1, wherein said ion-implant of the substrate is accomplished by using the side-by-side gates as the mask.

24. The method of claim 23, wherein said ion-implant is arsenic.

25. The method of claim 23, wherein the concentration of said arsenic ion-implant is in between about $1\times10^{15}$ to $1\times10^{16}$ atoms/cm$^2$.

26. The method of claim 23, wherein the energy of said arsenic ion-implant is between about 20 to 80 KEV.

27. A side-by-side structure for double floating gates in an EEPROM cell comprising:

a semiconductor substrate containing lightly doped regions formed by two implants and separated by a channel region;

a control gate formed over but insulated from said channel region;

two floating gates positioned side-by-side on either side of the control gate;

a double bit storage structure for a single memory cell.

28. The structure of claim 27, wherein said substrate is ion-implanted with arsenic.

29. The structure of claim 28, wherein said floating gates are ion-implanted with phosphorus.

30. The structure of claim 28, wherein said control gate is ion-implanted with phosphorous.

31. The structure of claim 27, wherein said floating gates are insulated from said control gate by an insulating layer of thickness in between about 100 to 400 Angstroms.

* * * * *